US011989553B2

(12) United States Patent
Tepper et al.

(10) Patent No.: US 11,989,553 B2
(45) Date of Patent: May 21, 2024

(54) TECHNOLOGIES FOR PERFORMING SPARSE LIFTING AND PROCRUSTEAN ORTHOGONAL SPARSE HASHING USING COLUMN READ-ENABLED MEMORY

(71) Applicant: Intel Corporation, Santa Clara, CA (US)

(72) Inventors: Mariano Tepper, Santa Clara, CA (US); Dipanjan Sengupta, Hillsboro, OR (US); Sourabh Dongaonkar, Santa Clara, CA (US); Chetan Chauhan, Folsom, CA (US); Jawad Khan, Portland, OR (US); Theodore Willke, Portland, OR (US); Richard Coulson, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 493 days.

(21) Appl. No.: 16/867,948

(22) Filed: May 6, 2020

(65) Prior Publication Data
US 2020/0264874 A1    Aug. 20, 2020

(51) Int. Cl.
*G06F 16/23* (2019.01)
*G06F 7/58* (2006.01)
(Continued)

(52) U.S. Cl.
CPC .............. *G06F 9/3001* (2013.01); *G06F 7/58* (2013.01); *G06F 9/30036* (2013.01);
(Continued)

(58) Field of Classification Search
CPC ...... G06F 9/3001; G06F 7/58; G06F 9/30036; G06F 16/137; G06F 16/2255;
(Continued)

(56) References Cited

U.S. PATENT DOCUMENTS 11,042,776 B1\* 6/2021 Buhler ............... H04N 1/00018
2013/0279806 A1\* 10/2013 Tonisson ................. G06F 16/56
382/173
(Continued)

OTHER PUBLICATIONS

Gao, X., Shen, F., Yang, Y., Xu, X., Li, H., & Shen, H. T. (Jul. 2017). Asymmetric sparse hashing. In 2017 IEEE International Conference on Multimedia and Expo (ICME) (pp. 127-132). IEEE. (Year: 2017).\*

(Continued)

*Primary Examiner* — Etienne P Leroux
*Assistant Examiner* — Oscar Wehovz
(74) *Attorney, Agent, or Firm* — Jordan IP Law, LLC

(57) ABSTRACT

Technologies for performing random sparse lifting and Procrustean orthogonal sparse hashing using column read-enabled memory include a device that has a memory that is column addressable and circuitry connected to the memory. The circuitry is configured to add a set of input data vectors to the memory as a set of binary dimensionally expanded vectors, including multiplying each input data vector with a projection matrix. The circuitry is also configured to produce a search hash code from a search data vector, including multiplying the search data vector with the projection matrix. Further, the circuitry is configured to determine a Hamming distance between the search hash code and each of the binary dimensionally expanded vectors.

17 Claims, 15 Drawing Sheets

(51) Int. Cl.
  *G06F 9/30*   (2018.01)
  *G06F 16/13*   (2019.01)
  *G06F 16/22*   (2019.01)
  *G06F 16/2455*   (2019.01)
  *G06F 16/9535*   (2019.01)
  *G06F 16/9538*   (2019.01)
  *H01L 27/06*   (2006.01)

(52) U.S. Cl.
  CPC ........ *G06F 16/137* (2019.01); *G06F 16/2255* (2019.01); *H01L 27/0688* (2013.01)

(58) Field of Classification Search
  CPC . G06F 16/583; G06F 7/08; G06F 7/02; G06F 15/7807; G06F 16/903; H01L 27/0688; G06N 20/00
  See application file for complete search history.

(56) References Cited

U.S. PATENT DOCUMENTS

| | | | | |
|---|---|---|---|---|
| 2018/0101742 | A1* | 4/2018 | Burge | G06F 16/5838 |
| 2019/0171665 | A1* | 6/2019 | Navlakha | G06F 16/538 |
| 2021/0072986 | A1* | 3/2021 | Yudanov | G11C 7/06 |

OTHER PUBLICATIONS

European Search Report for EPO Patent Application No. 20216310.1, dated Jun. 9, 2021, 53 pages.
GSI Technology, "In-Place Computing: Scaling to 1M Similarity Searches per Second", gsitechnology.com/sites/default/files/AppNotes/AN1027.pdf, 2017, 5 pages.
Landré, Jérôme et al., "Image Retrieval with Binary Hamming Distance", seitepress.org/Papers/2007/20460/20460.pdf, Mar. 2007, 4 pages.
Fakhfakh, Sana et al., "Image Retrieval Based on Using Hamming Distance", Procedia Computer Science, 2015, 8 pages.
Li, Wenye et al., "Fast Similarity Search via Optimal Sparse Lifting", papers.nips.cc/paper/2018/file/a8baa56554f96369ab93e4f3bb068c22-Paper.pdf, Dec. 2018, 9 pages.
Ryali, Chaitanya K et al., "Bio-Inspired Hashing For Unsupervised Similarity Search", arxiv.org/pdf/20OI.049O7vl.pdf, Jan. 14, 2020, 5 pages.
S. Dasgupta, C. F. Stevens, and S. Navlakha. A neural algorithm for a fundamental computing problem. Science, 358(6364):793-796, Nov. 2017.
Office Action for EPO Patent Application No. 20216310.1, dated Jun. 13, 2023, 10 pages.

* cited by examiner

US 11,989,553 B2

TECHNOLOGIES FOR PERFORMING SPARSE LIFTING AND PROCRUSTEAN ORTHOGONAL SPARSE HASHING USING COLUMN READ-ENABLED MEMORY

BACKGROUND

Content-based similarity search, or simply similarity search, is a key technique that underpins machine learning (ML) and artificial intelligence applications (AI). In performing a similarity search, query data, such as data indicative of an object (e.g., an image) is used to search a database to identify data indicative of similar objects (e.g., similar images). However, the sheer volume and richness of data used in large-scale similarity searches is an extremely challenging problem that is both compute and memory intensive.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
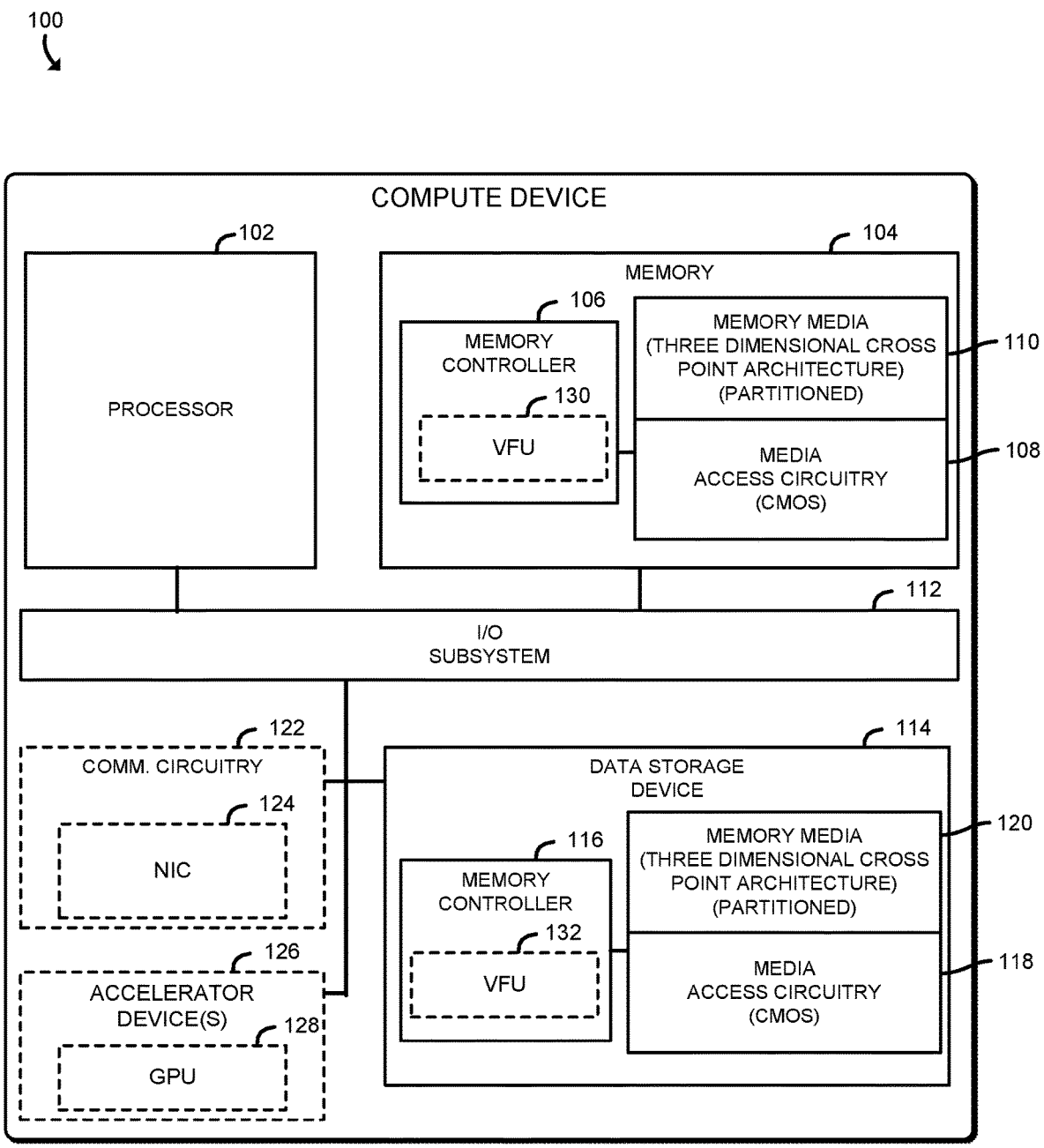
FIG. 1 is a simplified diagram of at least one embodiment of a compute device for performing similarity search acceleration using column-read enabled memory.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Referring now to FIG. 1, a compute device 100 for performing similarity search acceleration using column-read enabled memory includes a processor 102, a memory 104, an input/output (I/O) subsystem 112, a data storage device 114, communication circuitry 122, and one or more accelerator devices 126. Of course, in other embodiments, the compute device 100 may include other or additional components, such as those commonly found in a computer (e.g., a display, peripheral devices, etc.). Additionally, in some embodiments, one or more of the illustrative components may be incorporated in, or otherwise form a portion of, another component. The term "memory," as used herein in reference to performing similarity search acceleration, may refer to the memory 104 and/or the data storage device 114, unless otherwise specified. As explained in more detail herein, media access circuitry 108, 118 (e.g., any circuitry or device configured to access and operate on data in the corresponding memory media 110, 120) connected a corresponding memory media 110, 120 (e.g., any device or material that data is written to and read from) may access (e.g., read) individual columns (e.g., bits) of vectors for use in performing similarity searches, also referred to as "stochastic associative searches" (SAS). As such, the memory operates as a "stochastic associative memory" (e.g., is designed to enable the efficient performance of stochastic associative searches).

The memory media 110, in the illustrative embodiment, has a three dimensional cross point architecture that has data access characteristics that differ from other memory architectures (e.g., dynamic random access memory (DRAM)), such as enabling access to one bit per tile and incurring time delays between reads or writes to the same partition or other partitions. The media access circuitry 108 is configured to make efficient use (e.g., in terms of power usage and speed) of the architecture of the memory media 110, such as by accessing multiple tiles in parallel within a given partition. In some embodiments, the media access circuitry 108 may utilize scratch pads (e.g., relatively small, low latency memory) to temporarily retain and operate on data read from the memory media 110 and broadcast data read from one partition to other portions of the memory 104 to enable calculations (e.g., matrix operations) to be performed in parallel within the memory 104. Additionally, in the illustrative embodiment, instead of sending read or write requests to the memory 104 to access matrix data, the processor 102 may send a higher-level request (e.g., a request for a macro operation, such as a request to return a set of N search results based on a search key). As such, many compute operations, such as artificial intelligence operations (e.g., stochastic associative searches) can be performed in memory (e.g., in the memory 104 or in the data storage device 114), with minimal usage of the bus (e.g., the I/O subsystem 112) to transfer data between components of the compute device 100 (e.g., between the memory 104 or data storage device 114 and the processor 102).

In some embodiments the media access circuitry 108 is included in the same die as the memory media 110. In other embodiments, the media access circuitry 108 is on a separate die but in the same package as the memory media 110. In yet other embodiments, the media access circuitry 108 is in a separate die and separate package but on the same dual in-line memory module (DIMM) or board as the memory media 110.

The processor 102 may be embodied as any device or circuitry (e.g., a multi-core processor(s), a microcontroller, or other processor or processing/controlling circuit) capable of performing operations described herein, such as executing an application (e.g., an artificial intelligence related application that may utilize stochastic associative searches). In some embodiments, the processor 102 may be embodied as, include, or be coupled to a field-programmable gate array (FPGA), an application specific integrated circuit (ASIC), reconfigurable hardware or hardware circuitry, or other specialized hardware to facilitate performance of the functions described herein.

The memory 104, which may include a non-volatile memory (e.g., a far memory in a two-level memory scheme), includes the memory media 110 and the media access circuitry 108 (e.g., a device or circuitry, such as a processor, application specific integrated circuitry (ASIC), or other integrated circuitry constructed from complementary metal-oxide-semiconductors (CMOS) or other materials) underneath (e.g., at a lower location) and coupled to the memory media 110. The media access circuitry 108 is also connected to the memory controller 106, which may be embodied as any device or circuitry (e.g., a processor, a co-processor, dedicated circuitry, etc.) configured to selectively read from and/or write to the memory media 110 in response to corresponding requests (e.g., from the processor 102 which may be executing an artificial intelligence related application that relies on stochastic associative searches to recognize objects, make inferences, and/or perform related artificial intelligence operations). In some embodiments, the memory controller 106 may include a vector function unit (VFU) 130 which may be embodied as any device or circuitry (e.g., dedicated circuitry, reconfigurable circuitry, an application specific integrated circuit (ASIC), a field programmable gate array (FPGA), etc.) capable of offloading vector-based tasks from the processor 102 (e.g., comparing data read from specific columns of vectors stored in the memory media 110, determining Hamming distances between the vectors stored in the memory media 110 and a search key, sorting the vectors according to their Hamming distances, etc.).

Figure 2:
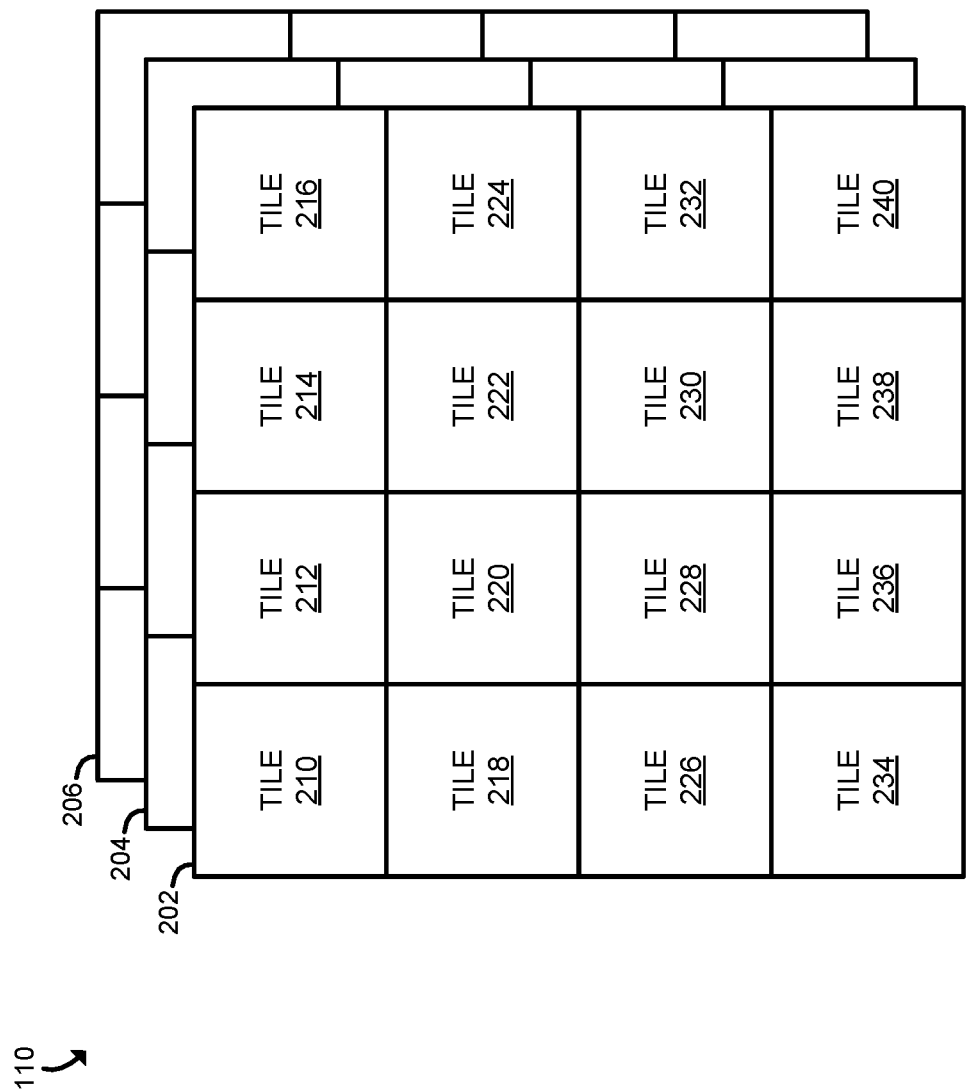
FIG. 2 is a simplified diagram of at least one embodiment of a memory media included in the compute device of FIG. 1.

Referring briefly to FIG. 2, the memory media 110, in the illustrative embodiment, includes a tile architecture, also referred to herein as a cross point architecture (e.g., an architecture in which memory cells sit at the intersection of word lines and bit lines and are individually addressable and in which bit storage is based on a change in bulk resistance), in which each memory cell (e.g., tile) 210, 212, 214, 216, 218, 220, 222, 224, 226, 228, 230, 232, 234, 236, 238, 240 is addressable by an x parameter and a y parameter (e.g., a column and a row). The memory media 110 includes multiple partitions, each of which includes the tile architecture. The partitions may be stacked as layers 202, 204, 206 to form a three dimensional cross point architecture (e.g., Intel 3D XPoint™ memory). Unlike typical memory devices, in which only fixed-size multiple-bit data structures (e.g., byte, words, etc.) are addressable, the media access circuitry 108 is configured to read individual bits, or other units of data, from the memory media 110 at the request of the memory controller 106, which may produce the request in response to receiving a corresponding request from the processor 102.

Referring back to FIG. 1, the memory 104 may include non-volatile memory and volatile memory. The non-volatile memory may be embodied as any type of data storage capable of storing data in a persistent manner (even if power is interrupted to the non-volatile memory). For example, the non-volatile memory may be embodied as one or more non-volatile memory devices. The non-volatile memory devices may include one or more memory devices configured in a cross point architecture that enables bit-level addressability (e.g., the ability to read from and/or write to individual bits of data, rather than bytes or other larger units of data), and are illustratively embodied as three dimensional (3D) cross point memory. In some embodiments, the non-volatile memory may additionally include other types of memory, including any combination of memory devices that use chalcogenide phase change material (e.g., chalcogenide glass), ferroelectric transistor random-access memory (FeTRAM), nanowire-based non-volatile memory, phase change memory (PCM), memory that incorporates memristor technology, Magnetoresistive random-access memory (MRAM) or Spin Transfer Torque (STT)-MRAM. The volatile memory may be embodied as any type of data storage capable of storing data while power is supplied volatile memory. For example, the volatile memory may be embodied as one or more volatile memory devices, and is periodically referred to hereinafter as volatile memory with the understanding that the volatile memory may be embodied as other types of non-persistent data storage in other embodiments. The volatile memory may have an architecture that enables bit-level addressability, similar to the architecture described above.

The processor 102 and the memory 104 are communicatively coupled to other components of the compute device 100 via the I/O subsystem 112, which may be embodied as circuitry and/or components to facilitate input/output operations with the processor 102 and/or the main memory 104 and other components of the compute device 100. For example, the I/O subsystem 112 may be embodied as, or otherwise include, memory controller hubs, input/output control hubs, integrated sensor hubs, firmware devices, communication links (e.g., point-to-point links, bus links, wires, cables, light guides, printed circuit board traces, etc.), and/or other components and subsystems to facilitate the input/output operations. In some embodiments, the I/O subsystem 112 may form a portion of a system-on-a-chip (SoC) and be incorporated, along with one or more of the processor 102, the main memory 104, and other components of the compute device 100, in a single chip.

The data storage device 114 may be embodied as any type of device configured for short-term or long-term storage of data such as, for example, memory devices and circuits, memory cards, hard disk drives, solid-state drives, or other data storage device. In the illustrative embodiment, the data storage device 114 includes a memory controller 116, similar to the memory controller 106, memory media 120 (also referred to as "storage media"), similar to the memory media 110, and media access circuitry 118, similar to the media access circuitry 108. Further, the memory controller 116 may also include a vector function unit (VFU) 132 similar to the vector function unit (VFU) 130. The data storage device 114 may include a system partition that stores data and firmware code for the data storage device 114 and one or more operating system partitions that store data files and executables for operating systems.

The communication circuitry 122 may be embodied as any communication circuit, device, or collection thereof, capable of enabling communications over a network between the compute device 100 and another device. The communication circuitry 122 may be configured to use any one or more communication technology (e.g., wired or wireless communications) and associated protocols (e.g., Ethernet, Bluetooth®, Wi-Fi®, WiMAX, etc.) to effect such communication.

The illustrative communication circuitry 122 includes a network interface controller (NIC) 124, which may also be referred to as a host fabric interface (HFI). The NIC 124 may be embodied as one or more add-in-boards, daughter cards, network interface cards, controller chips, chipsets, or other devices that may be used by the compute device 100 to connect with another compute device. In some embodiments, the NIC 124 may be embodied as part of a system-on-a-chip (SoC) that includes one or more processors, or included on a multichip package that also contains one or more processors. In some embodiments, the NIC 124 may include a local processor (not shown) and/or a local memory (not shown) that are both local to the NIC 124. In such embodiments, the local processor of the NIC 124 may be capable of performing one or more of the functions of the processor 102. Additionally or alternatively, in such embodiments, the local memory of the NIC 124 may be integrated into one or more components of the compute device 100 at the board level, socket level, chip level, and/or other levels. The one or more accelerator devices 126 may be embodied as any device(s) or circuitry capable of performing a set of operations faster than the general purpose processor 102. For example, the accelerator device(s) 126 may include a graphics processing unit 128, which may be embodied as any device or circuitry (e.g., a co-processor, an ASIC, reconfigurable circuitry, etc.) capable of performing graphics operations (e.g., matrix operations) faster than the processor 102.

Figure 3:
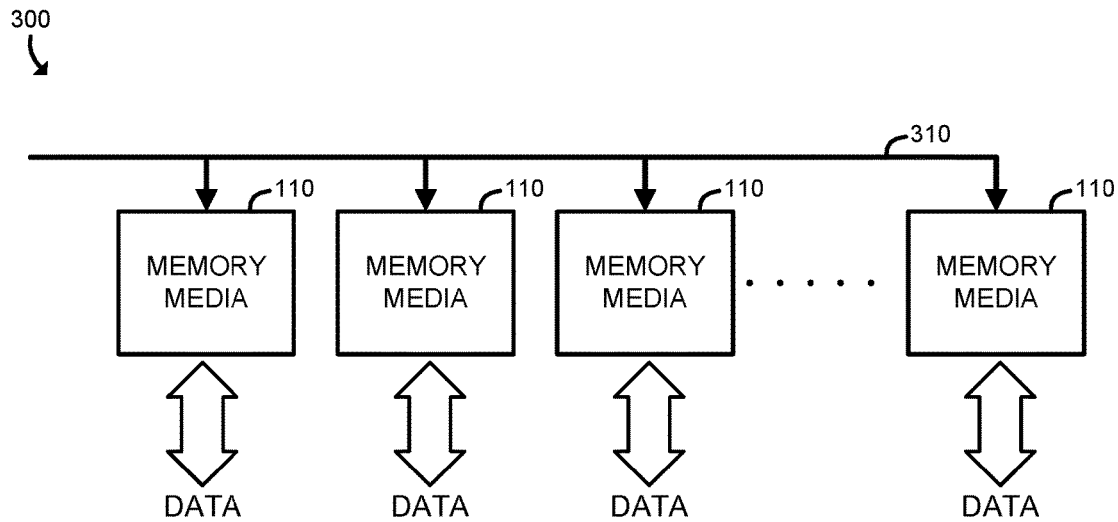
FIG. 3 is a simplified diagram of at least on embodiment of the memory media of the compute device of FIG. 1 in a dual in-line memory module (DIMM)

Referring now to FIG. 3, the compute device 100, in some embodiments, may utilize a dual in-line memory module (DIMM) architecture 300. In the architecture 300, multiple dies of the memory media 110 are connected with a shared command address bus 310. As such, in operation, data is read out in parallel across all of the memory media 110 connected to the shared command address bus 310. Data may be laid out across the memory media 110 in a configuration to allow reading the same column across all of the connected dies of the memory media 110.

Figure 4:
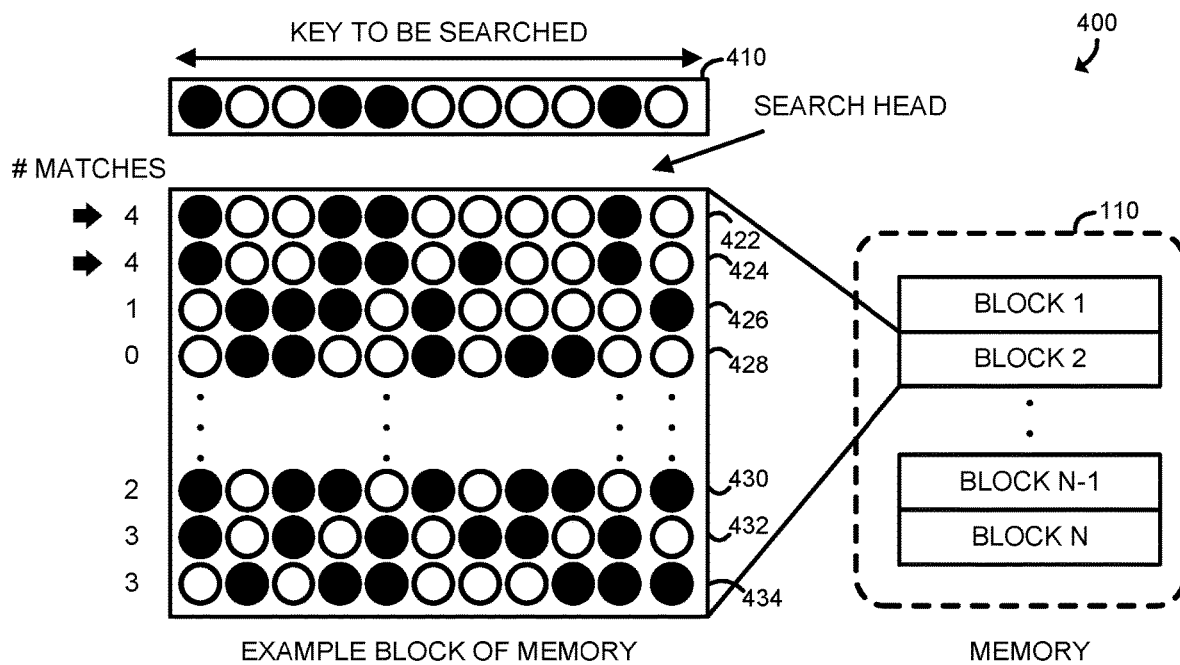
FIG. 4 is a simplified diagram of a stochastic associative search (SAS) performed using a binary search key on the memory media of FIGS. 1-3.

Referring now to FIG. 4, the compute device 100 may perform a stochastic associative search 400, which is a highly efficient and fast way of searching through a large database of records and finding similar records to a given query record (key). For simplicity and clarity, the stochastic associative search 400 and other processes are described herein as being performed with the memory 104. However, it should be understood that the processes could alternatively or additionally be performed with the storage device 114, depending on the particular embodiment. Given that the memory media 110 allows both row and column-wise reads with similar read latency, the memory media 110 is particularly suited to enabling efficient stochastic associative searches. As described in more detail herein, to utilize the characteristics of the memory media 110 to perform efficient (e.g., accelerated, using less power and time than would otherwise be consumed) stochastic associative searches, the compute device 100 writes database elements (e.g., records, vectors, rows, etc.) to the memory media 110 in binary format (e.g., ones and zeros) as hash codes (e.g., sequences of values produced by a hashing function), that are sparse (e.g., have more zeros than ones). Subsequently, in performing a search, individual binary values of the search key 410 are compared to the corresponding binary values in the database elements (e.g., vectors) 422, 424, 426, 428, 430, 432, 434 stored in the blocks of the memory media 110. The compute device 100 determines the number of matching binary values between the search key 410 and each database element (e.g., vector), which is representative of a Hamming distance between the search key 410 and each database element (e.g., vector). The database elements (e.g., vectors) having the greatest number of matches (e.g., lowest Hamming distance) are the most similar results (e.g., the result set) for the stochastic associative search 400.

Example flows of operations may proceed as follows depending on the particular embodiment (e.g. whether the vector function unit 130 is present). The elements are stored in the memory media 110 as binary vectors using row write operations. For a given stochastic associative search, the compute device 100 formats a search query using a hash encoding that matches the hash encoding used to produce the binary format of the vectors in the database. In at least some embodiments in which the VFU 130 is not present, the processor 102 sends a block column read request to the memory controller 106 to read specified columns (e.g., the columns corresponding to the set bits (bits having a value of one) in search key 410). The processor 102 subsequently ranks the top matching rows (e.g., vectors) based on the number of set bits matching for the column data that was read. The processor 102 subsequently identifies the top N similar rows for the application requesting the search results. In at least some embodiments in which the VFU 130 is present, the process may proceed as follows. The processor 102 may send an instruction to the memory controller 106 to perform a macro operation (e.g., return top N results based on a given search key 410). Subsequently, the memory controller 106 sends a block column read request to the media access circuitry 108 to read, from the memory media 110, the columns corresponding to the set bits in the search key 410. The VFU 130 in the memory controller 106 subsequently ranks and sorts the top N matching rows (e.g., vectors) based on the number of set bits matching the column data that was read, and the memory controller 106 subsequently sends, to the processor 102, data indicative of the top N matching rows (e.g., vectors) as the search results.

Figure 5:
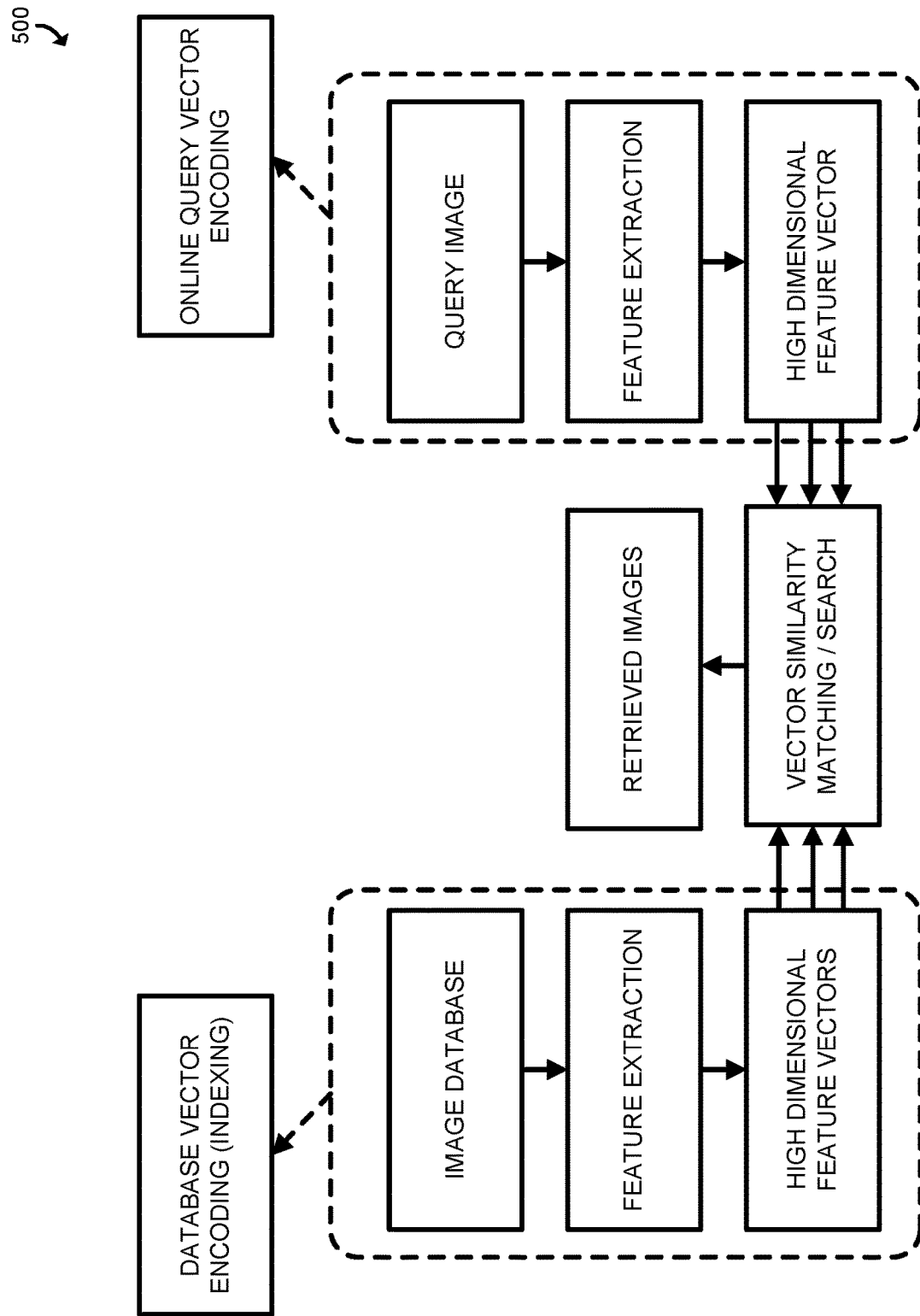
FIG. 5 is a simplified diagram of at least one embodiment of a content-based image retrieval (CBIR) system that may be implemented using the compute device of FIG. 1.
Figure 6:
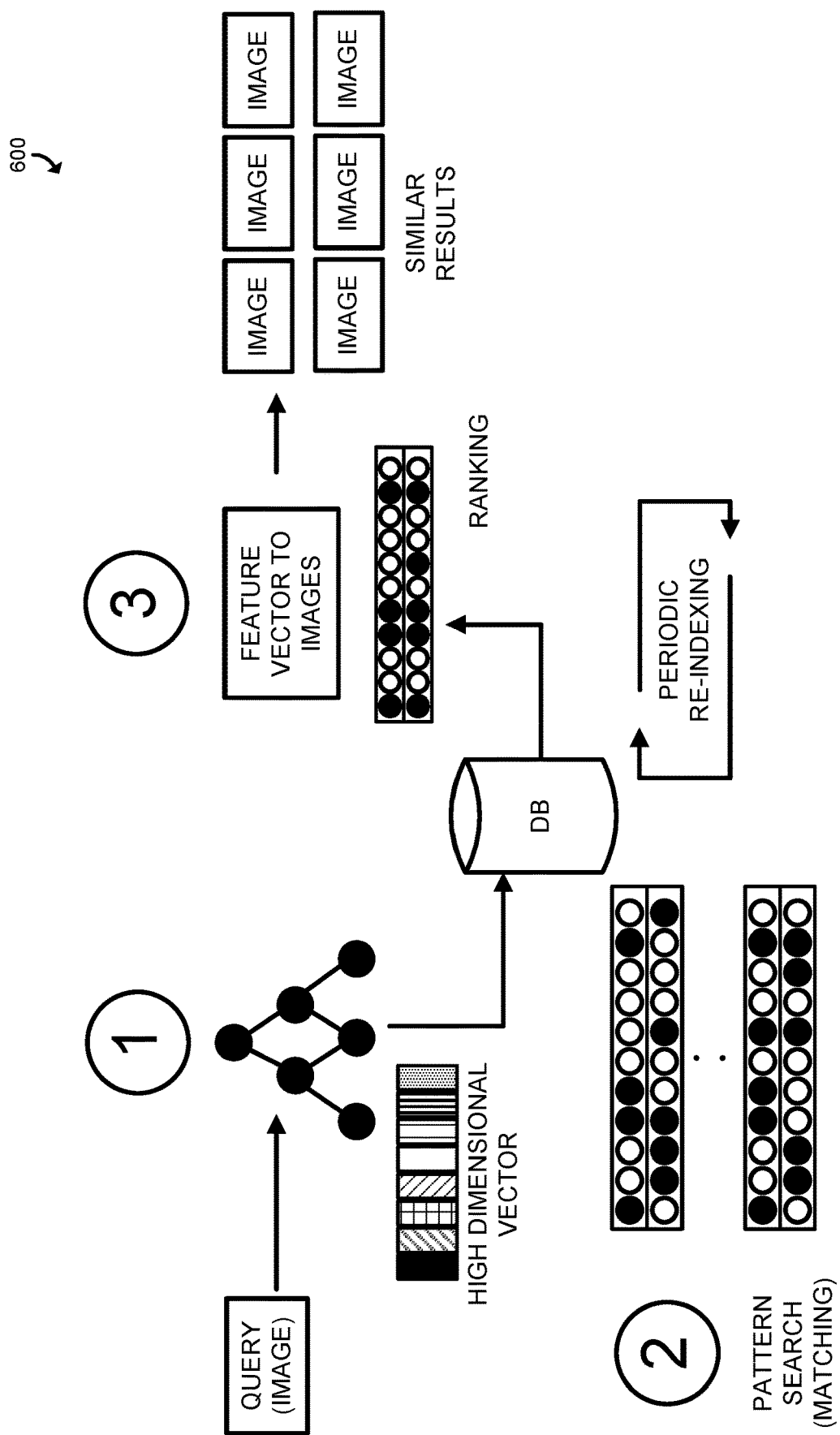
FIG. 6 is a simplified diagram of a deep learning-based similarity search workflow for the CBIR system of FIG. 5.

Referring now to FIG. 5, a content-based image retrieval system 500 may be implemented with the compute device 100. Given a database of high-dimensional vectors and a query vector q (e.g., the search key 410 of FIG. 4) of the same dimensions, the content-based image retrieval (CBIR) system 500 searches for database vectors (e.g., the vectors 422, 424, 426, 428, 430, 432, 434 of FIG. 4) that are similar or closer to q than others, based on a similarity function (e.g., a function that determines a distance between the query vector and each database vector). For example, the content-based image retrieval system 500 identifies similar images in a database using a query image. A feature extraction step may involve a deep learning model or other type of process, such as a human-designed algorithm. FIG. 6 illustrates a deep learning-based similarity search workflow 600 for the CBIR system 500, where the vectors represent the extracted features from the content of images. In other embodiments, the vectors may represent the content of other objects (e.g., sounds, video, bioinformatics data, etc.) extracted and summarized (e.g., via deep learning or another process). In the illustrative embodiment, the present compute device 100, in operation, implements a content-based similarity search system (e.g., the system 500) that significantly improves the runtime performance (e.g., speed, power usage, etc.) and accuracy of a search. In particular, the compute device 100 operates on modern, large-scale (e.g., order of billions), complex, and high-dimensional datasets, utilizing the unique features of the memory media 110 (e.g., column and row addressability).

Figure 7:
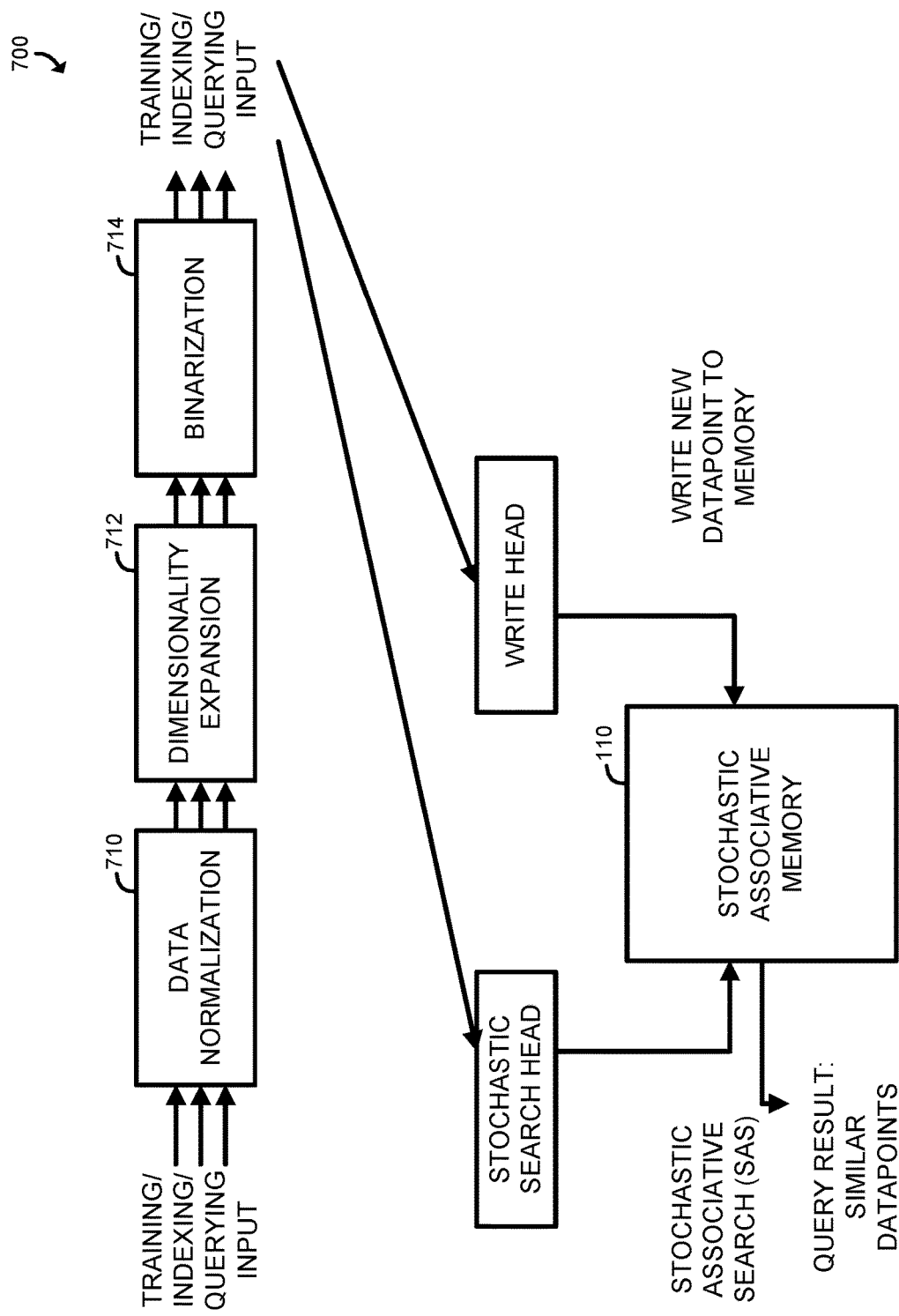
FIG. 7 is a diagram of a random sparse lifting (RSL) data and control flow similarity search pipeline that may be implemented using the memory media of the compute device of FIG. 1.
Figure 8:
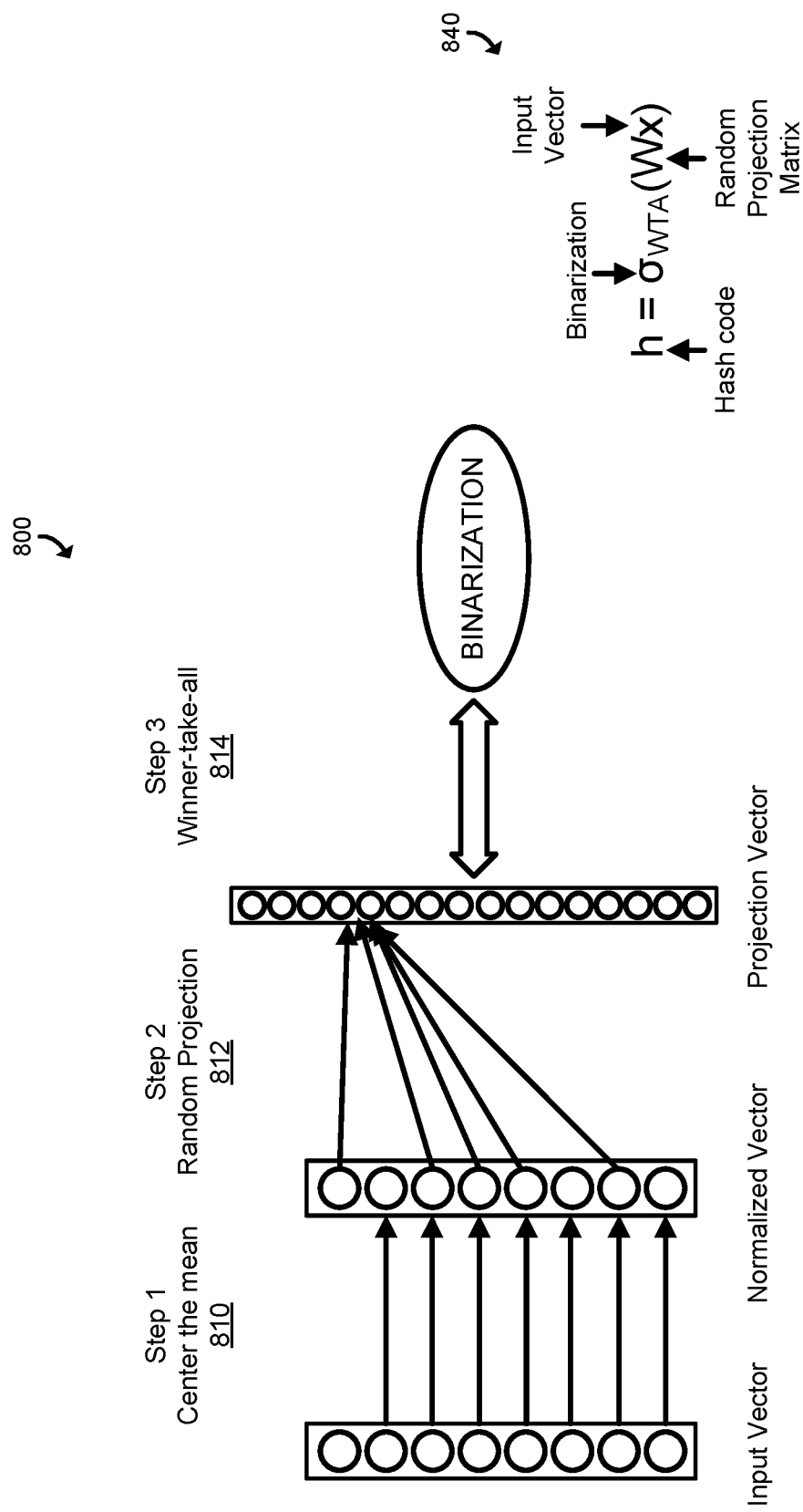
FIG. 8 is a diagram of an algorithmic pipeline for random sparse lifting (RSL) and a mathematical equation for performing RSL that may be implemented using the compute device of FIG. 1.

Referring now to FIG. 7, the compute device 100 may implement a random sparse lifting (RSL) data and control flow similarity search pipeline 700 using the memory media 110. Also referring to FIG. 8, an algorithmic pipeline 800 which may be utilized by the compute device 100 for performing random sparse lifting (RSL) and a mathematical equation 840 for performing RSL are shown. In random sparse lifting, the compute device 100 takes an input vector x (e.g., a d-dimensional floating point vector) and operates in the following three steps, as illustrated in FIGS. 7 and 8, in manner similar to the olfactory system of the *Drosophila melanogaster* (the fruit fly). In one step 710, 810, the compute device 100 performs data normalization. In doing so, the compute device 100 normalizes input data to add invariance to specific deformations (e.g., translations, rotations, sheer stress, etc.). For example, the compute device 100 may determine the mean of the values in input data (e.g., in an input data vector) and remove (e.g., subtract) the mean from the values. In a subsequent step 720, 820, the compute device 100 performs dimensionality expansion. In doing so, the compute device 100 randomly projects the normalized input data to a higher dimensional space D where D is greater than d (e.g., 20 to 40 fold increase in dimensionality). The random projection ensures that each element in the higher-dimensional projection vector receives and sums relatively few elements from the input vector, as shown in FIG. 8. The procedure can be formalized as matrix multiplication of input vector x and a binary sparse projection matrix W of dimension (Dxd). The compute device 100 stores the random sparse projection matrix W (also referred to as the model parameter) in memory (e.g., the memory 104) to be used for subsequent queries. In a subsequent step 730, 830, the compute device 100 binarizes the projection vector to produce a hash code using a winner-take-all (WTA) strategy in which only a small fraction of top entries (e.g., largest values) in the projection vector (e.g., 5% of D) are set to one and the rest are set to zero. The RSL procedure efficiently leverages the unique features of the memory media (e.g., the ability to read individual columns) to accelerate a similarity search on a large scale database (e.g., order of a billion elements) without losing the accuracy of the results. Specifically, the algorithm generates sparse binary hash codes and is a distance preserving transformation from input to Hamming space. Hamming distances between hash codes reflect the Euclidean distance between the data points that produced them. Further, the sparse binary hash code reduces the number of memory read operations that would otherwise be required because of the relatively few ones compared to zeros in the hash code, and information is contain only in the set bits (e.g., the bits set to one) in the binary hash code. As such, the binary hash code satisfies all of the requirements of the stochastic associative search and can benefit from the in-memory binary search acceleration provided by the memory 104.

Figure 9:
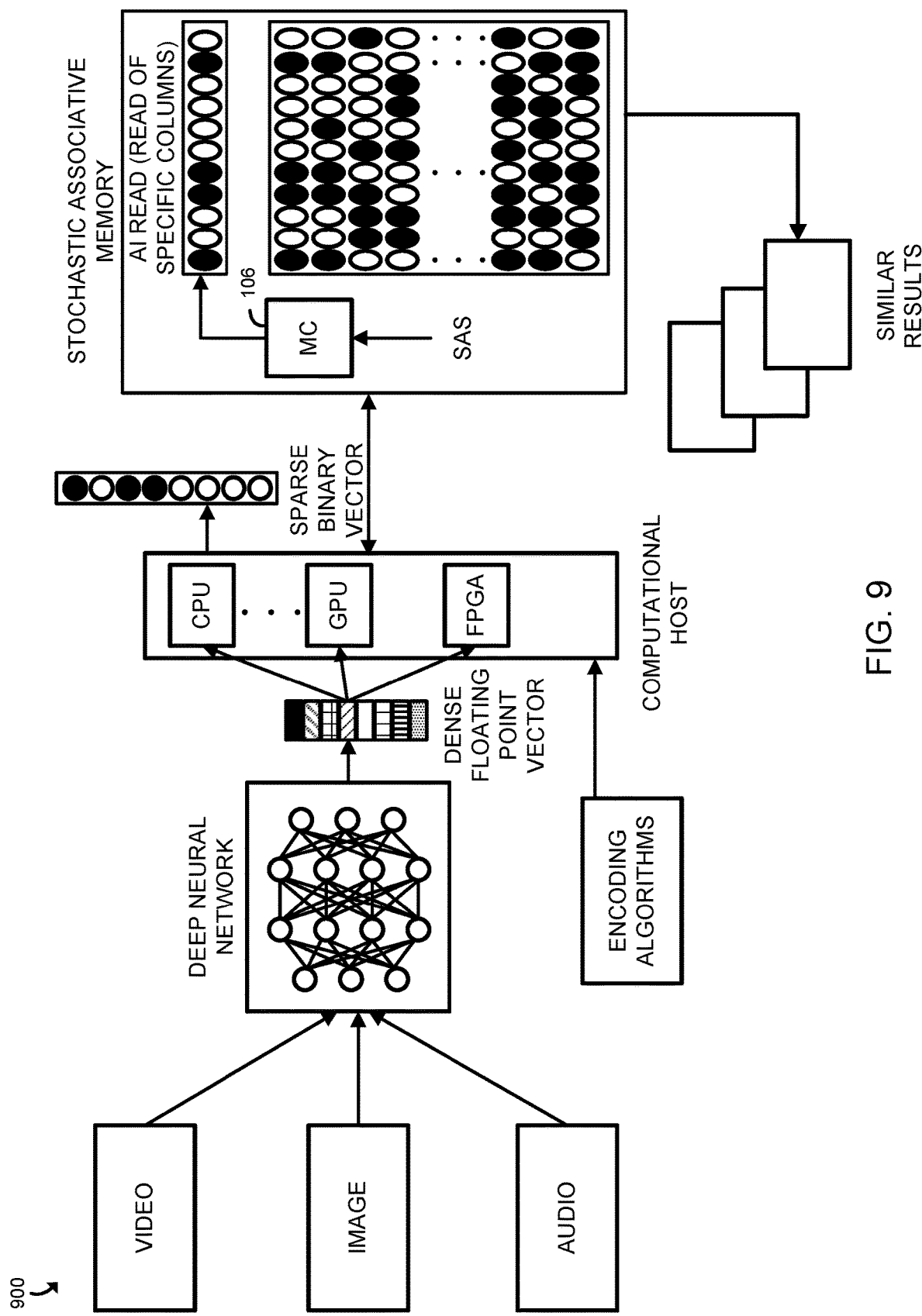
FIG. 9 is a diagram of a hardware mapping of stages of the RSL pipeline of FIG. 8.

Referring now to FIG. 9, at least one embodiment of a hardware mapping 900 of the stages of an RSL pipeline (similar to the pipeline 700) is shown. During training, a random sparse projection matrix W is generated using which the input data set is transformed from floating point vectors to high-dimensional sparse binary hash codes. As shown in FIG. 8, the transformation is performed by a computational host (e.g., a central processing unit (CPU), a graphics processing unit (GPU), a field programmable gate array (FPGA), or other circuitry). Subsequently, the hash codes and the projection matrix W are stored in a stochastic associative memory (e.g., the memory media 110). The same sparse projection matrix W is also used during indexing to generate binary hash codes for new elements added to the database. Query processing involves retrieving the stored matrix W and performing the above three steps to generate the sparse binary code to be used for searching (e.g., the search key 410 of FIG. 4). The compute device 100 compares the query hash code (e.g., the search key 410) with the database hash codes (e.g., the vectors 422, 424, 426, 428, 430, 432, 434) and calculates the pair-wise Hamming distances (e.g., based on the matching bits, as described above). The comparison, in the illustrative embodiment, is performed in the memory (e.g., in the memory 104). Further, in the illustrative embodiment, the memory 104 (e.g., the memory controller 106) at least partially sorts the database elements (e.g., the vectors 422, 424, 426, 428, 430, 432, 434) based on the Hamming distances and returns the indices of the closest matching vectors 422, 424, 426, 428, 430, 432, 434 (e.g., the closest matching N vectors).

Figure 10:
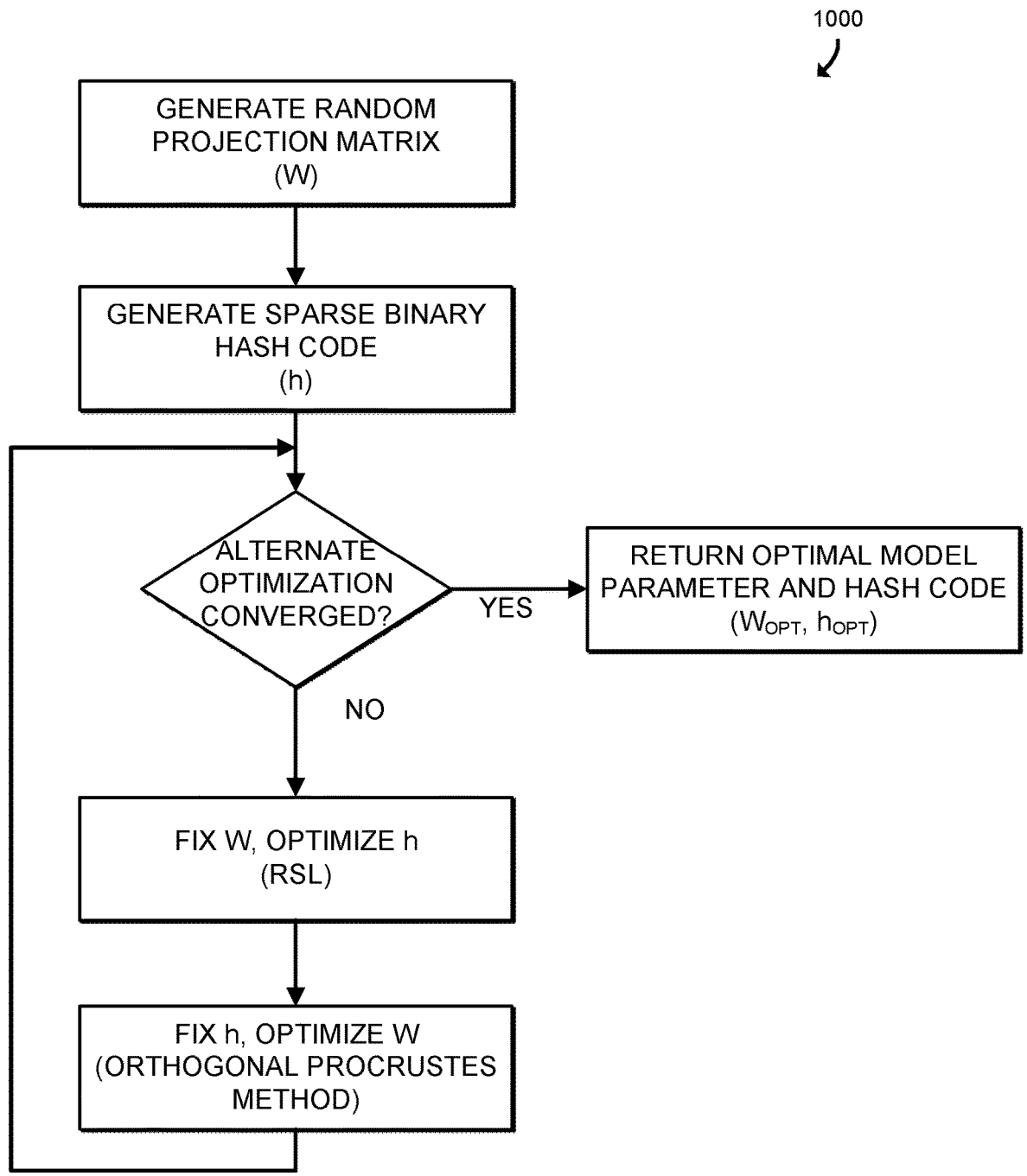
FIG. 10 is a diagram of a flow that may be utilized by the compute device of FIG. 1 to perform Procrustean orthogonal sparse hashing (POSH)

Referring now to FIG. 10, the compute device 100, in operation, may execute a method 1000 to optimize (e.g., adapt) the projection matrix W to produce more accurate search results for a given type of data to be searched. The method 1000 is referred to herein as Procrustean orthogonal sparse hashing (POSH). While the random sparse lifting method described above provides acceleration for similarity search using the stochastic associative memory (e.g., the memory media 110), using POSH to adapt (e.g., optimize) the projection matrix W retains the benefits of RSL while increasing the accuracy of the search results. The key drawback of the RSL method is that it uses random values in the sparse projection matrix for the computation of hash codes, which does not adapt the machine learning model to the data being searched. Stated differently, the RSL method does not learn from the input data. The POSH method 1000, by contrast, utilizes machine learning to adapt the projection matrix W to provide an improved (e.g., over the RSL method) data transformation for dimensionality expansion.

Figure 11:
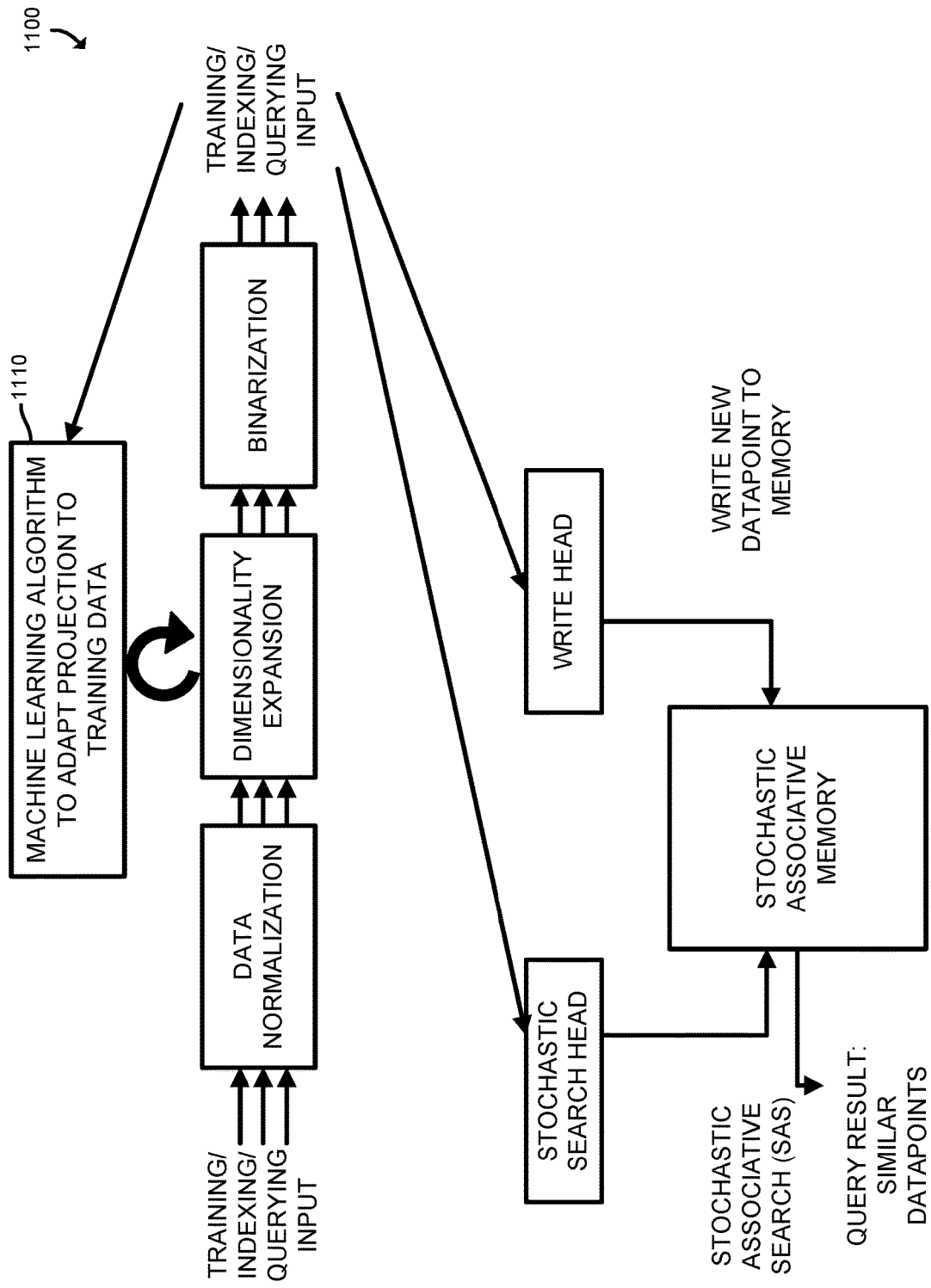
FIG. 11 is a data and control flow diagram of a POSH similarity search pipeline that may be implemented using the compute device of FIG. 1.
Figure 12:
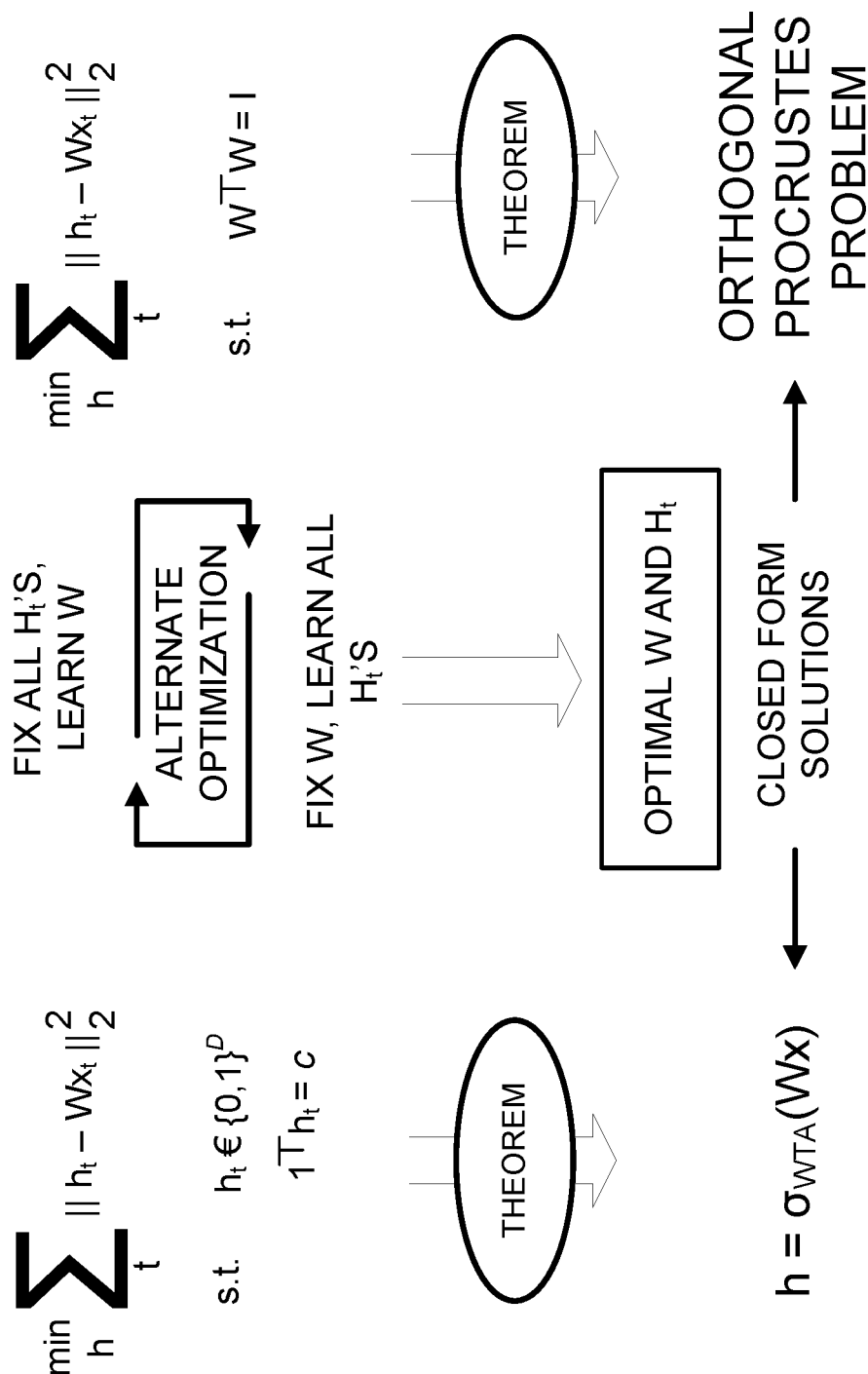
FIG. 12 is an algorithmic representation of POSH and corresponding optimization problems and closed-form solutions that may be implemented using the compute device of FIG. 1.

Referring briefly to FIG. 11, a pipeline 1100, similar to the pipeline 700 of FIG. 7, includes a machine learning process 1110, similar to the method 1000, to adapt the projection (e.g., the projection matrix W) to training data. The machine learning process is based on an alternate optimization approach. Referring to FIG. 10 and FIG. 12, the alternate optimization approach proceeds as follows. The compute device 100 initializes the projection matrix W as a random sparse binary projection matrix and computes a hash code h using the RSL method described above. Subsequently, the compute device 100 fixes W and optimizes the hash code h. The optimization problem has a closed form similar to the RSL method, as shown in FIG. 12. Keeping the optimized h from the previous iteration fixed, the compute device 100 then optimizes for W (e.g., the projection matrix) as an orthogonal Procrustes problem, which also has a closed form solution, as indicated in FIG. 12. The compute device 100 subsequently iterates through the above two steps until both W and h converge to their corresponding optimal values.

Figure 13:
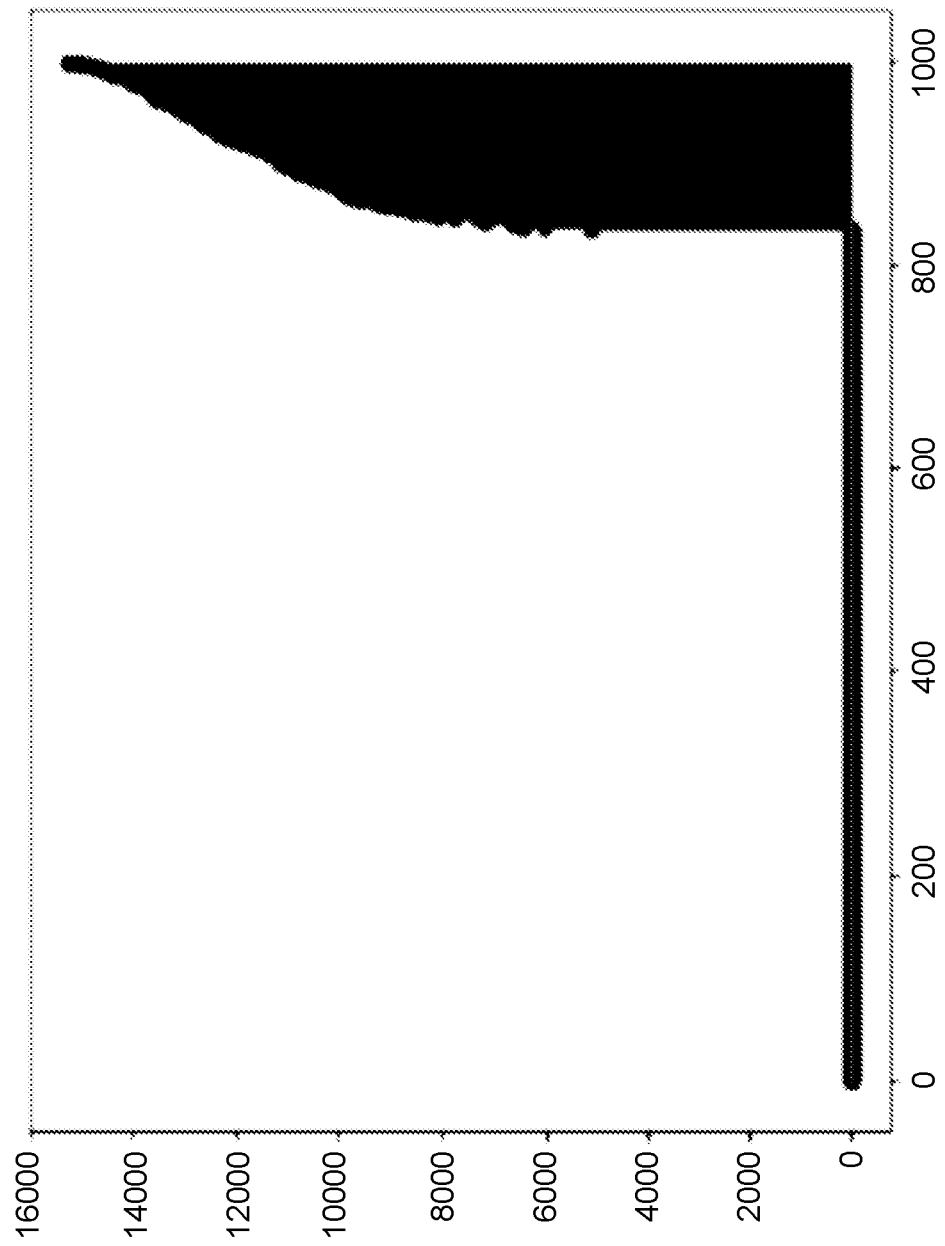
FIG. 13 is a plot of a distribution of set bits in a hash code of length 1024 that may be produced by the compute device of FIG. 1.

Because each of the steps in the alternate optimization method has closed form solutions, the POSH process reaches convergence relatively quickly (e.g., after 50 to 100 iterations) on large scale datasets (e.g., billions of records). Performing the POSH process provides more accurate search results than the RSL method described above, and at the same time satisfies the encoding properties of RSL. Hence, the POSH process can be combined with the accelerated search operations described above (e.g., described in relation to RSL) to provide fast and highly efficient results for similarity searches. Referring briefly to FIG. 13, a distribution 1300 of set bits (e.g., bits having a value of one) in a hash code (e.g., a hash code h produced using the projection matrix W optimized using the POSH method) is shown. As indicated in FIG. 13, the set bits in the hash code h have a nearly uniform distribution.

Figure 14:
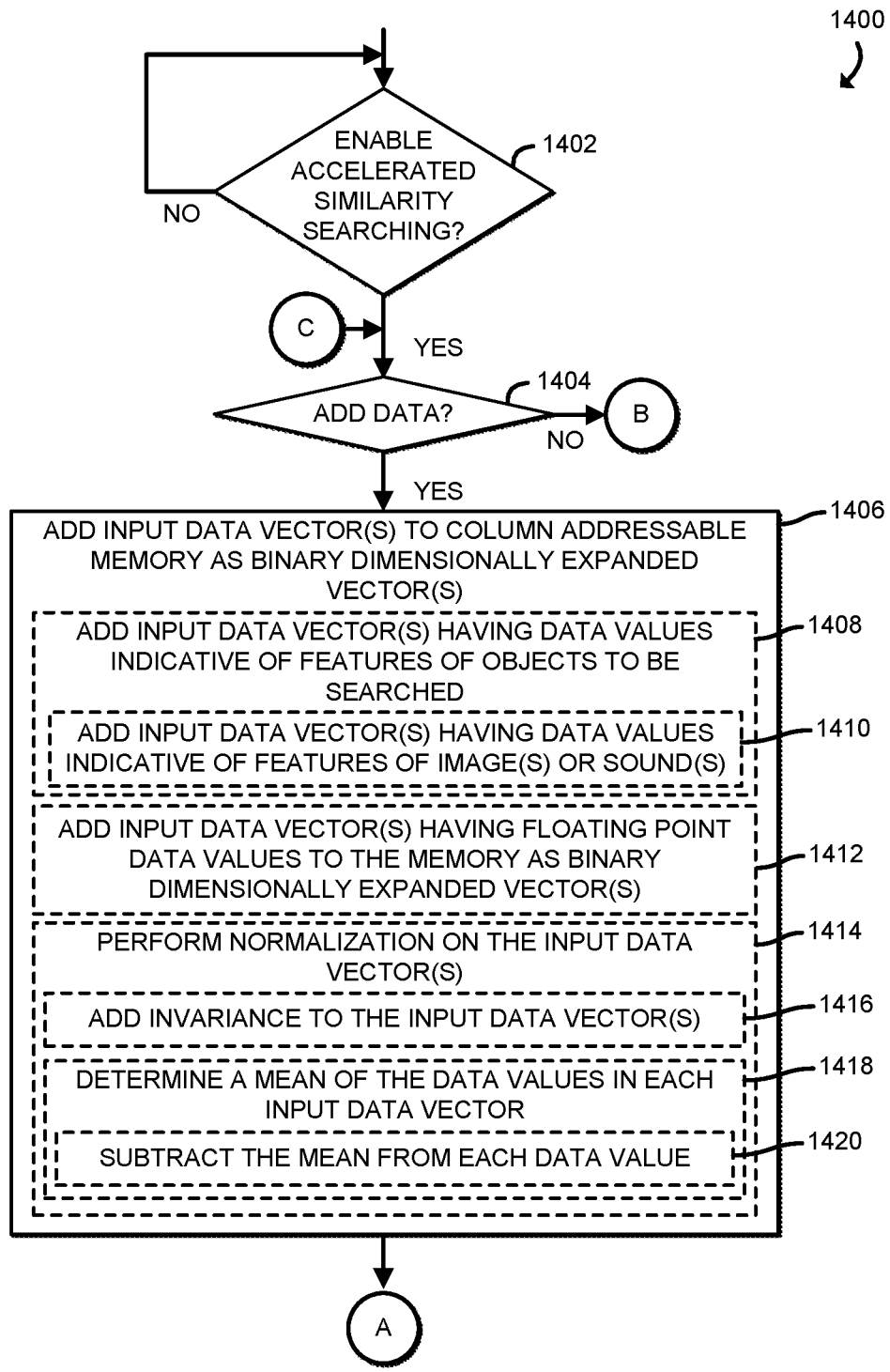
FIGS. 14-16 are flow diagrams of at least one embodiment of a method for performing accelerated similarity searches that may be performed by the compute device of FIG. 1.

Referring now to FIG. 14, the compute device 100, in operation, may execute a method 1400 for performing accelerated similarity searches. The method 1400 begins with block 1402 in which the compute device 100 determines whether to enable accelerated similarity searching. In doing so the compute device 100 may determine to enable accelerated similarity searching in response to a request from an application (e.g., executed by the processor 102) to enable accelerated searching, in response to determining that a configuration setting (e.g., in a configuration file) indicates to enable accelerated searching, and/or based on other factors. Regardless, in response to a determination to enable accelerated searching, the method 1400 advances to block 1404, in which the compute device 100 determines whether to add data (e.g., input data to be searched). The compute device 100 may determine to add data in response to a request from an application (e.g., executed by the processor 102) to add data to be searched, in response to a request from another compute device 100 (e.g., a request received via the communication circuitry 122) to add data, in response to a determination that a source for input data includes new data that has not yet been indexed (e.g., converted to binary dimensionally expanded vectors in the memory media 110) by the compute device 100 and/or based on other factors.

In response to a determination to add data, the method 1400 advances to block 1406, in which the compute device 100 adds one or more input data vectors to column addressable memory as binary dimensionally expanded vector(s) (e.g., one binary dimensionally expanded vector per input data vector). In doing so, and as indicated in block 1408, the compute device 100, in the illustrative embodiment, adds one or more input data vectors having data values that are indicative of features of objects to be searched (e.g., based on feature extraction process). For example, and as indicated in block 1410, the compute device 100 may add one or more input data vectors having data values indicative of features of images or sounds. In other embodiments, the input data vectors may have data values indicative of other types of objects to be searched (e.g. videos, bioinformatics data such as genetic sequences, etc.). As indicated in block 1412, the compute device 100, in the illustrative embodiment, adds input data vector(s) have floating point data values to the memory (e.g., the memory media 110) as binary dimensionally expanded vectors. In the illustrative embodiment, the compute device 100 performs normalization on the input data vector(s), as indicated in block 1414. In doing so, the compute device 100 adds invariance to the input data vectors, as indicated in block 1416. In some embodiments, to normalize the input data vector(s), the compute device 100 determines a mean of the data values in the input data vector(s), as indicated in block 1418, and subtracts the mean from each data value, as indicated in block 1420. The normalization process is also shown as steps 710 in FIGS. 7 and 810 in FIG. 8. Subsequently, the method 1400 advances to block 1422 of FIG. 15, in which the compute device 100, in the illustrative embodiment, performs dimensionality expansion on each input data vector.

Figure 15:
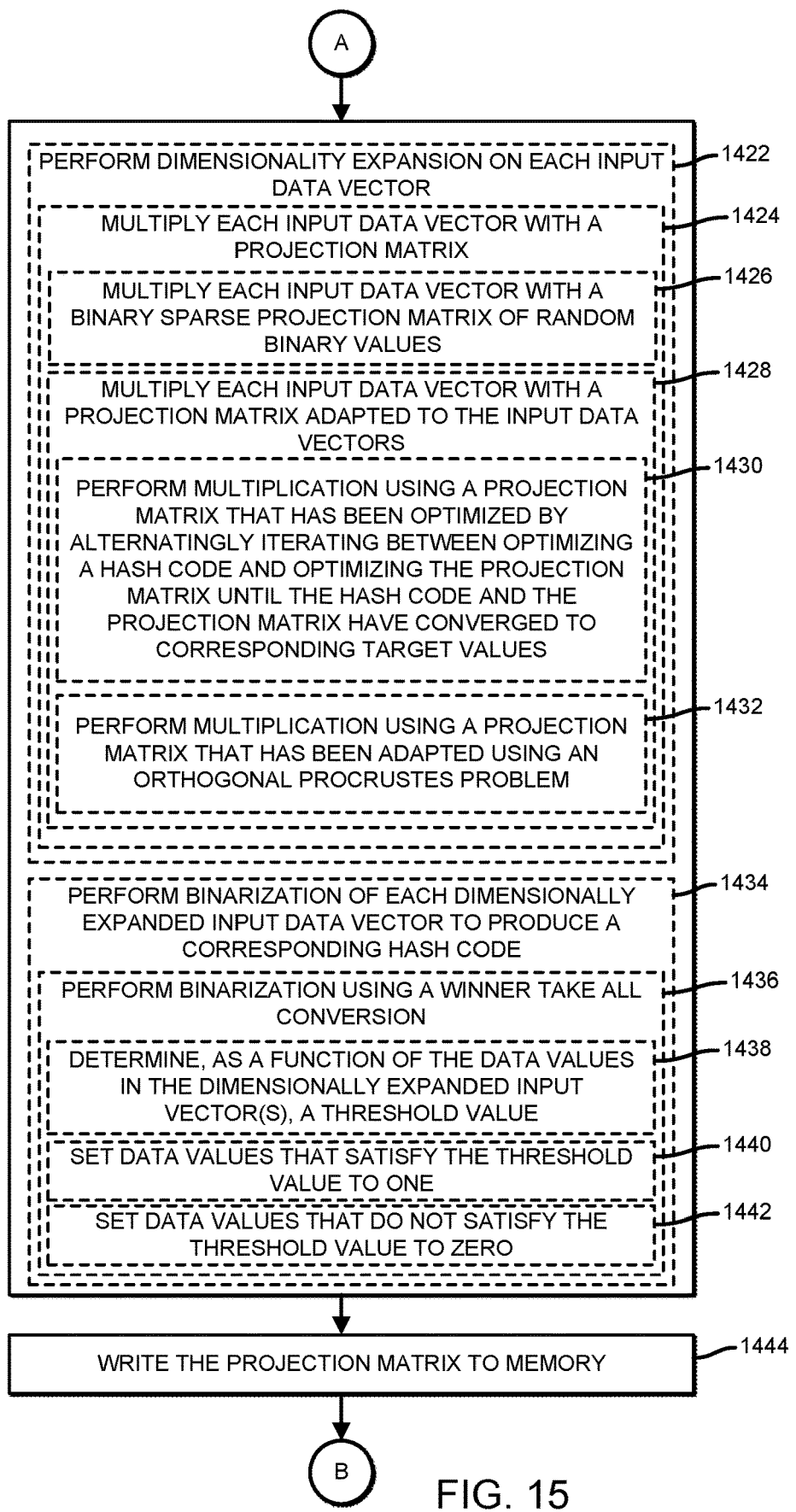

Referring now to FIG. 15, and as indicated in block 1424, in performing dimensionality expansion, the compute device 100 multiplies each input data vector with a projection matrix (e.g., the binary sparse projection matrix W). As indicated in block 1426, the compute device 100 may multiply each input data vector with a binary sparse projection matrix (W) of random binary values (e.g., random sparse lifting). The dimensionality expansion using a binary sparse projection matrix of random binary values is also represented in step 712 of FIG. 7. Alternatively, in other embodiments, the compute device 100 may multiply each input data vector with a projection matrix (W) (e.g., a dense floating point matrix) adapted to the input data vectors (e.g., the POSH method), to provide more accurate search results than the random sparse lifting approach, as indicated in block 1428. In doing so, and as indicated in block 1430, the compute device 100 may perform multiplication using a projection matrix (e.g., a dense floating point matrix) that has been optimized by alternatingly iterating between optimizing a hash code and optimizing the projection matrix until the hash code and the projection matrix have converged to corresponding target values. As indicated in block 1432, the compute device 100 may perform multiplication using a projection matrix (e.g., a dense floating point matrix) that has been adapted using the orthogonal Procrustes problem. The optimization of the projection matrix is described above relative to FIG. 10 (e.g., the method 1000), FIG. 11 (e.g., machine learning process 1110), and FIG. 12.

As indicated in block 1434, the compute device 100, in the illustrative embodiment, performs binarization of each dimensionally expanded input data vector to produce a corresponding hash code. The binarization operation is also represented in FIG. 7 (e.g., as step 714), FIG. 8 (e.g., as step 814), and FIG. 11. In doing so, and as indicated in block 1436, the compute device 100 may perform the binarization using a winner-take-all conversion. For example, and as indicated in blocks 1438, 1440, and 1442, the compute device 100 may determine, as a function of the data values in a given dimensionally expanded input vector, a threshold value (e.g., a value representative of the Nth percentage of the largest values represented in the dimensionally expanded input vector), set all data values in the dimensionally expanded input vector that satisfy (e.g., are equal to or greater than) the threshold value to one and set all data values that do not satisfy the threshold value to zero. As indicated in block 1444, the compute device 100 writes the projection matrix to memory (e.g., the memory 104). Subsequently, or if the determination in block 1404 of FIG. 14 is not to add data, the method 1400 advances to block 1446 of FIG. 16, in which the compute device 100 determines whether a search query has been obtained (e.g., received, such as from an application executed by the processor 102).

Figure 16:
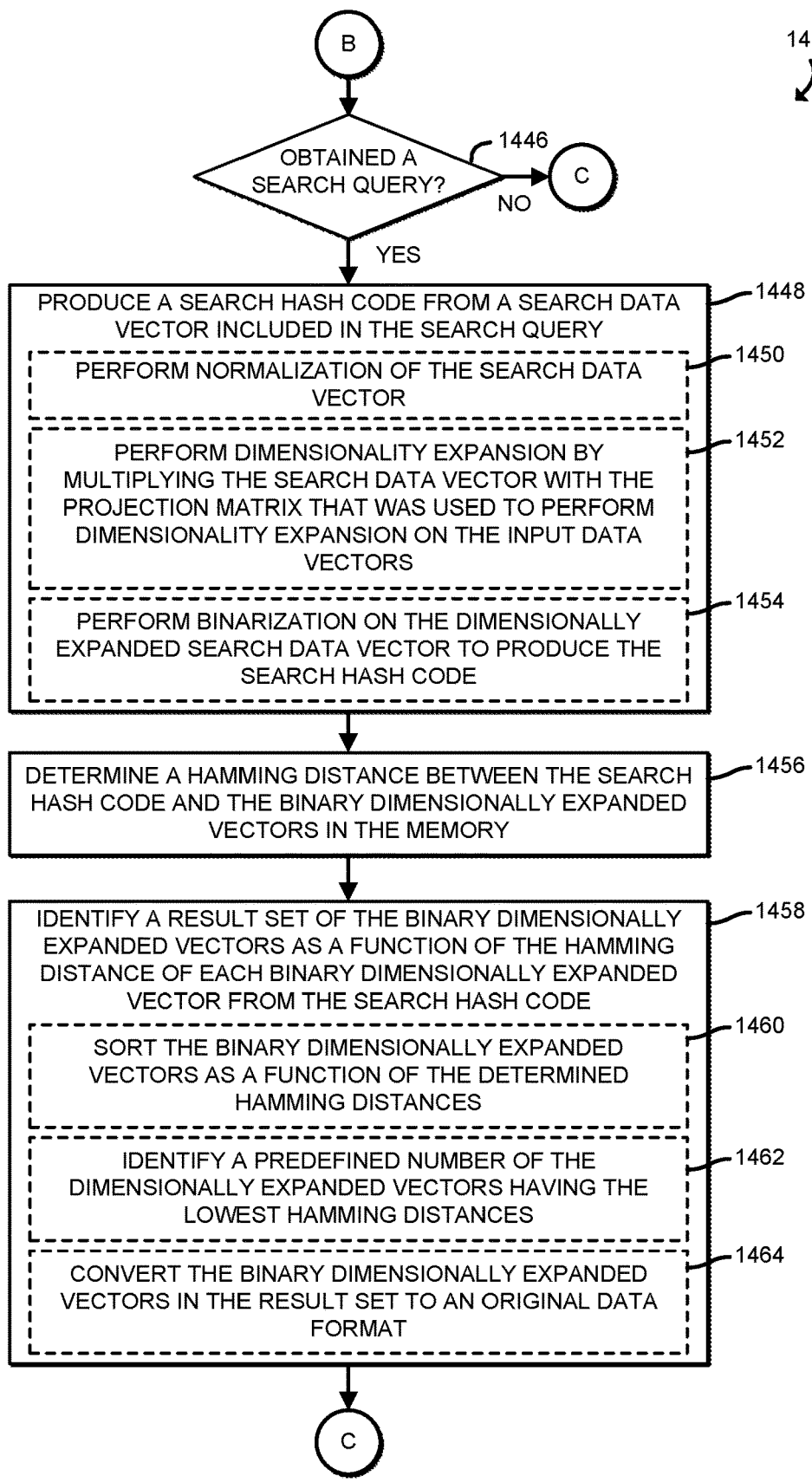

Referring now to FIG. 16, in response to a determination that a search query has not been obtained, the method 1400 loops back to block 1404 of FIG. 14 in which the compute device 100 again determines whether to add data (e.g., index additional data to be searched). Otherwise (e.g., if a search query has been obtained), the method 1400 advances to block 1448, in which the compute device produces a search hash code from a search data vector included in the search query. That is, in the illustrative embodiment, the compute device 100 obtains a search data vector having values indicative of features of an object (e.g., an image, audio, a video, bioinformatics data, etc.) to be used in a similarity search (e.g., a stochastic similarity search) to identify data (e.g., in the memory media 110) similar to the object. In doing so, and as indicated in block 1450, the compute device 100 performs normalization of the search data vector (e.g., similar to the operations in block 1414 of FIG. 14). Further, and as indicated in block 1452, the compute device 100, in the illustrative embodiment, performs dimensionality expansion by multiplying the search data vector with the projection matrix that was used to perform dimensionality expansion on the input data vectors (e.g., the projection matrix that was written to memory in block 1444 of FIG. 15). Additionally, in the illustrative embodiment and as indicated in block 1454, the compute device 100 performs binarization on the dimensionally expanded search data vector to produce the search hash code (e.g., the search key 410 of FIG. 4). The compute device 100, in the illustrative embodiment, performs the binarization in a process similar to the binarization process of block 1434 of FIG. 15.

Subsequently, and as indicated in block 1456, the compute device 100 determines a Hamming distance between the search hash code (e.g., the search key 410) and the binary dimensionally expanded vectors in the memory (e.g., the memory media 110), such as by determining how many set bits match between the search hash code and each binary dimensionally expanded vector, as described relative to FIG. 4. Subsequently, in block 1458, the compute device 100 identifies a result set of the binary dimensionally expanded vectors as a function of the Hamming distance of each binary dimensionally expanded vector from the search hash code (e.g., the search key 410). In doing so, and as indicated in block 1460, the compute device 100 in the illustrative embodiment, sorts the binary dimensionally expanded vectors as a function of their determined Hamming distances (e.g., from lowest distance to greatest distance). Further, and as indicated in block 1462, the compute device 100 identifies a predefined number of the dimensionally expanded vectors having the lowest Hamming distances (e.g., ten (or a requested number of search results specified in a search query) dimensionally expanded vectors having the lowest Hamming distances). Additionally, the compute device 100 may convert the binary dimensionally expanded vectors in the result set to an original data format (e.g., the format prior to normalization, dimensional expansion, and binarization, such as the floating point format), as indicated in block 1464. Having identified the result set from the search (e.g., for use by the requesting application), the method 1400, in the illustrative embodiment, loops back to block 1404 of FIG. 14, in which the compute device 100 determines whether to add additional data to the memory (e.g., index additional data to be searchable).

EXAMPLES

Illustrative examples of the technologies disclosed herein are provided below. An embodiment of the technologies may include any one or more, and any combination of, the examples described below.

Example 1 includes a device comprising a memory that is column addressable; circuitry connected to the memory, wherein the circuitry is to add a set of input data vectors to the memory as a set of binary dimensionally expanded vectors, including multiplying each input data vector with a projection matrix; produce a search hash code from a search data vector, including multiplying the search data vector with the projection matrix; and determine a Hamming distance between the search hash code and each of the binary dimensionally expanded vectors.

Example 2 includes the subject matter of Example 1, and wherein multiplying each input data vector with a projection matrix comprises multiplying each input data vector with a projection matrix that includes random binary values.

Example 3 includes the subject matter of any of Examples 1 and 2, and wherein multiplying each input data vector with a projection matrix comprises multiplying each input data vector with a projection matrix having values optimized for input data in the input data vectors.

Example 4 includes the subject matter of any of Examples 1-3, and wherein to add the set of input data vectors to the memory as binary dimensionally expanded vectors comprises to perform normalization on each input data vector before multiplying each input data vector with the projection matrix.

Example 5 includes the subject matter of any of Examples 1-4, and wherein multiplying each input data vector with the projection matrix produces a set of dimensionally expanded input data vectors, and the circuitry is further to perform binarization on each dimensionally expanded input data vector.

Example 6 includes the subject matter of any of Examples 1-5, and wherein to perform binarization on each dimensionally expanded input data vector comprises to determine, as a function of data values in a dimensionally expanded input data vector, a threshold value; set each data value that satisfies the threshold value to one; and set each data value that does not satisfy the threshold value to zero.

Example 7 includes the subject matter of any of Examples 1-6, and wherein multiplying each input data vector with a projection matrix comprises multiplying input data vectors having floating point data with the projection matrix.

Example 8 includes the subject matter of any of Examples 1-7, and wherein multiplying each input data vector with a projection matrix comprises multiplying input data vectors having data values indicative of features extracted from objects to be searched with the projection matrix.

Example 9 includes the subject matter of any of Examples 1-8, and wherein multiplying each input data vector with a projection matrix comprises multiplying input data vectors having data values indicative of features extracted from images to be searched with the projection matrix.

Example 10 includes the subject matter of any of Examples 1-9, and wherein the circuitry is further to identify a result set of the binary dimensionally expanded vectors as a function of the Hamming distance of each binary dimensionally expanded vector from the search hash code, wherein the result set is a subset of the set of dimensionally expanded vectors.

Example 11 includes the subject matter of any of Examples 1-10, and wherein the circuitry is further to sort the binary dimensionally expanded vectors as a function of the Hamming distance of each binary dimensionally expanded vector from the search hash code.

Example 12 includes the subject matter of any of Examples 1-11, and wherein to add an input data vector to the memory as binary dimensionally expanded vector comprises to determine a mean of data values in the input data vector and remove the mean from the data values in the input data vector before multiplying the input data vector with the projection matrix.

Example 13 includes the subject matter of any of Examples 1-12, and wherein the memory is column addressable and row addressable.

Example 14 includes the subject matter of any of Examples 1-13, and wherein the memory has a three dimensional cross point architecture.

Example 15 includes a method comprising adding, by a device having a memory that is column addressable, a set of input data vectors to the memory as a set of binary dimensionally expanded vectors, including multiplying each input data vector with a projection matrix; producing, by the device, a search hash code from a search data vector, including multiplying the search data vector with the projection matrix; and determining, by the device, a Hamming distance between the search hash code and each of the binary dimensionally expanded vectors.

Example 16 includes the subject matter of Example 15, and wherein multiplying each input data vector with a projection matrix comprises multiplying each input data vector with a projection matrix that includes random binary values.

Example 17 includes a system comprising a processor; a memory that is column addressable; circuitry connected to the memory, wherein the circuitry is to add a set of input data vectors to the memory as a set of binary dimensionally expanded vectors, including multiplying each input data vector with a projection matrix; produce a search hash code from a search data vector, including multiplying the search data vector with the projection matrix; and determine a Hamming distance between the search hash code and each of the binary dimensionally expanded vectors.

Example 18 includes the subject matter of Example 17, and wherein the circuitry is in a data storage device.

Example 19 includes the subject matter of any of Examples 17 and 18, and wherein the circuitry is in a memory device.

Example 20 includes one or more machine-readable storage media comprising a plurality of instructions stored thereon that, in response to being executed, cause a device having a memory that is column addressable to add a set of input data vectors to the memory as a set of binary dimensionally expanded vectors, including multiplying each input data vector with a projection matrix; produce a search hash code from a search data vector, including multiplying the search data vector with the projection matrix; and determine a Hamming distance between the search hash code and each of the binary dimensionally expanded vectors.

The invention claimed is:

1. A device comprising:
a memory that is column addressable;
a processor comprising circuitry connected to the memory, wherein the circuitry is to:
add a set of input data vectors to the memory as a set of binary dimensionally expanded vectors, including multiplying each input data vector with a projection matrix, wherein multiplying each input data vector with a projection matrix comprises operations to:
normalize input data from the set of input data vectors to add invariance to one or more specific deformations;
project the normalized input data to a different dimensional space to form a dimensionally expanded projection matrix;
binarize the dimensionally expanded projection matrix to produce a binary dimensionally expanded projection matrix corresponding with a binary dimensionally expanded hash code;
adapt a binary sparse projection matrix via procrustean orthogonal sparse hashing, the procrustean orthogonal sparse hashing comprising operations to: multiply each input data vector with a projection matrix having values optimized for the input data in the set of input data vectors by alternatingly iterating between optimizing the binary dimensionally expanded hash code and optimizing the binary dimensionally expanded projection matrix until the binary dimensionally expanded hash code and the binary dimensionally expanded projection matrix have converged to corresponding target values, wherein the procrustean orthogonal sparse hashing bypasses usage of random values in the binary sparse projection matrix during iterative computation of the binary dimensionally expanded hash code;
produce a search hash code from a search data vector, including multiplying the search data vector with the projection matrix; and
determine a Hamming distance between the search hash code and each of the binary dimensionally expanded vectors.

2. The device of claim 1, wherein to add the set of input data vectors to the memory as binary dimensionally expanded vectors comprises to perform normalization on each input data vector before multiplying each input data vector with the projection matrix.

3. The device of claim 1, wherein multiplying each input data vector with the projection matrix produces a set of dimensionally expanded input data vectors, and the circuitry is further to perform binarization on each dimensionally expanded input data vector.

4. The device of claim 3, wherein to perform binarization on each dimensionally expanded input data vector comprises to:
  determine, as a function of data values in a dimensionally expanded input data vector, a threshold value;
  set each data value that satisfies the threshold value to one; and
  set each data value that does not satisfy the threshold value to zero.

5. The device of claim 1, wherein multiplying each input data vector with the projection matrix comprises multiplying input data vectors having floating point data with the projection matrix.

6. The device of claim 1, wherein multiplying each input data vector with the projection matrix comprises multiplying input data vectors having data values indicative of features extracted from objects to be searched with the projection matrix.

7. The device of claim 6, wherein multiplying each input data vector with the projection matrix comprises multiplying input data vectors having data values indicative of features extracted from images to be searched with the projection matrix.

8. The device of claim 1, wherein the circuitry is further to identify a result set of the binary dimensionally expanded vectors as a function of the Hamming distance of each binary dimensionally expanded vector from the search hash code, wherein the result set is a subset of the set of dimensionally expanded vectors.

9. The device of claim 8, wherein the circuitry is further to sort the binary dimensionally expanded vectors as a function of the Hamming distance of each binary dimensionally expanded vector from the search hash code.

10. The device of claim 1, wherein to add an input data vector to the memory as binary dimensionally expanded vector comprises to determine a mean of data values in the input data vector and remove the mean from the data values in the input data vector before multiplying the input data vector with the projection matrix.

11. The device of claim 1, wherein the memory is column addressable and row addressable.

12. The device of claim 1, wherein the memory has a three dimensional cross point architecture.

13. A method comprising:
  adding, by a device having a memory that is column addressable, a set of input data vectors to the memory as a set of binary dimensionally expanded vectors, including multiplying each input data vector with a projection matrix, wherein multiplying each input data vector with the projection matrix comprises:
  normalizing input data from the set of input data vectors to add invariance to one or more specific deformations;
  projecting the normalized input data to a different dimensional space to form a dimensionally expanded projection matrix;
  binarizing the dimensionally expanded projection matrix to produce a binary dimensionally expanded projection matrix corresponding with a binary dimensionally expanded hash code;
  adapting a binary sparse projection matrix via procrustean orthogonal sparse hashing, the procrustean orthogonal sparse hashing comprising: multiplying each input data vector with the projection matrix having values optimized for the input data in the set of input data vectors by alternatingly iterating between optimizing the binary dimensionally expanded hash code and optimizing the binary dimensionally expanded projection matrix until the binary dimensionally expanded hash code and the binary dimensionally expanded projection matrix have converged to corresponding target values, wherein the procrustean orthogonal sparse hashing bypasses usage of random values in the binary sparse projection matrix during iterative computation of the binary dimensionally expanded hash code;
  producing, by the device, a search hash code from a search data vector, including multiplying the search data vector with the projection matrix; and
  determining, by the device, a Hamming distance between the search hash code and each of the binary dimensionally expanded vectors.

14. A system comprising:
  a processor;
  a memory that is column addressable;
  circuitry connected to the memory, wherein the circuitry is to:
  add a set of input data vectors to the memory as a set of binary dimensionally expanded vectors, including multiplying each input data vector with a projection matrix, wherein multiplying each input data vector with the projection matrix comprises operations to:
  normalize input data from the set of input data vectors to add invariance to one or more specific deformations;
  project the normalized input data to a different dimensional space to form a dimensionally expanded projection matrix;
  binarize the dimensionally expanded projection matrix to produce a binary dimensionally expanded projection matrix corresponding with a binary dimensionally expanded hash code;
  adapt a binary sparse projection matrix via procrustean orthogonal sparse hashing, the procrustean orthogonal sparse hashing comprising operations to: multiply each input data vector with the projection matrix having values optimized for the input data in the set of input data vectors by alternatingly iterating between optimizing the binary dimensionally expanded hash code and optimizing the binary dimensionally expanded projection matrix until the binary dimensionally expanded hash code and the binary dimensionally expanded projection matrix have converged to corresponding target values, wherein the procrustean orthogonal sparse hashing bypasses usage of random values in the binary sparse projection matrix during iterative computation of the binary dimensionally expanded hash code;
  produce a search hash code from a search data vector, including multiplying the search data vector with the projection matrix; and
  determine a Hamming distance between the search hash code and each of the binary dimensionally expanded vectors.

15. The system of claim 14, wherein the circuitry is in a data storage device.

16. The system of claim 14, wherein the circuitry is in a memory device.

17. One or more non-transitory machine-readable storage media comprising a plurality of instructions stored thereon that, in response to being executed, cause a device having a memory that is column addressable to:
  add a set of input data vectors to the memory as a set of binary dimensionally expanded vectors, including multiplying each input data vector with a projection matrix, wherein multiplying each input data vector with the projection matrix comprises operations to:

normalize input data from the set of input data vectors to add invariance to one or more specific deformations;

project the normalized input data to a different dimensional space to form a dimensionally expanded projection matrix;

binarize the dimensionally expanded projection matrix to produce a binary dimensionally expanded projection matrix corresponding with a binary dimensionally expanded hash code;

adapt a binary sparse projection matrix via procrustean orthogonal sparse hashing, the procrustean orthogonal sparse hashing comprising operations to: multiply each input data vector with the projection matrix having values optimized for the input data in the set of input data vectors by alternatingly iterating between optimizing the binary dimensionally expanded hash code and optimizing the binary dimensionally expanded projection matrix until the binary dimensionally expanded hash code and the binary dimensionally expanded projection matrix have converged to corresponding target values, wherein the procrustean orthogonal sparse hashing bypasses usage of random values in the binary sparse projection matrix during iterative computation of the binary dimensionally expanded hash code;

produce a search hash code from a search data vector, including multiplying the search data vector with the projection matrix; and determine a Hamming distance between the search hash code and each of the binary dimensionally expanded vectors.

* * * * *